United States Patent [19]
Yang

[11] Patent Number: 5,429,962
[45] Date of Patent: Jul. 4, 1995

[54] METHOD FOR FABRICATING A LIQUID CRYSTAL DISPLAY

[75] Inventor: Myoung S. Yang, Kyungki-do, Rep. of Korea

[73] Assignee: Goldstar Co., Ltd., Seoul, Rep. of Korea

[21] Appl. No.: 168,018

[22] Filed: Dec. 15, 1993

[30] Foreign Application Priority Data

Dec. 22, 1992 [KR] Rep. of Korea ............... 25127/1992

[51] Int. Cl.⁶ .......................................... H01L 21/265
[52] U.S. Cl. .......................................... 437/40; 437/21; 437/60; 437/186; 437/191; 437/192; 359/59
[58] Field of Search ............ 437/40, 21, 60, 186, 437/191, 192, 193, 194; 359/59

[56] References Cited

U.S. PATENT DOCUMENTS

| | | | |
|---|---|---|---|
| 4,885,616 | 12/1989 | Ohta | 359/59 |
| 5,132,821 | 7/1992 | Nicholas | 359/59 |
| 5,173,792 | 12/1992 | Matsueda | 359/59 |
| 5,183,780 | 2/1993 | Noguchi et al. | 437/186 |
| 5,214,295 | 5/1993 | Manning | 437/186 |
| 5,233,211 | 8/1993 | Hayashi et al. | 359/59 |
| 5,272,099 | 12/1993 | Chou et al. | 437/193 |
| 5,289,300 | 2/1994 | Yamazaki et al. | 359/59 |

FOREIGN PATENT DOCUMENTS 1129234 5/1989 Japan ......................... 359/59

*Primary Examiner*—Kevin Picardat
*Attorney, Agent, or Firm*—John P. White

[57] ABSTRACT

A method for fabricating a top gate type polysilicon TFT liquid crystal display by: forming an active layer on a thin film transistor-forming region of a buffer layer atop a transparent substrate; forming a gate insulating film, gate electrode on the active region and a gate line implanting impurity ions in the active layer by use of the gate electrode as a mask so as to form a source region and a drain region; depositing an insulating film; forming contact holes in the insulating film, exposing the source region and the drain region therethrough; forming a transparent electrode on a picture cell of the insulating film; depositing a semiconductor layer doped with high density impurity and a metal layer, in due order; and applying an etch to the semiconductor layer and the metal layer selectively as to form a source electrode and a data line which are connected with the source region and to form a drain electrode which interconnects the drain region with the transparent electrode.

1 Claim, 6 Drawing Sheets

METHOD FOR FABRICATING A LIQUID CRYSTAL DISPLAY

BACKGROUND OF THE INVENTION

The present invention relates, in general, to a liquid crystal display, and more particularly to a method for fabricating a liquid crystal display using a top gate polysilicon thin film transistor (hereinafter "TFT") as a switching element and wherein source and drain electrodes are formed of an n+ polysilicon and a metal.

In general, a liquid crystal display is structured to have a liquid crystal material injected between two glass substrates with electrodes. As the optical properties of liquid crystal are changed when applying a voltage to the electrode, an image is shown in the liquid crystal display.

Such liquid crystal display may be broadly divided into simple matrix operating types and active matrix operating types. The simple matrix operating type employs the method a scanning voltage utilizing time divisional operation and a data signal voltage. On the other hand, in the active matrix type, each picture cell which has an independent active element (switching element) is independently operated, so that the influence caused by neighboring picture cells can be minimized, thereby enhancing the contrast and increasing the number of scanning lines.

In such an active matrix operating type, a thin film transistor is employed as an active element. The thin film transistor may be categorized as amorphous silicon TFT and polysilicon TFT, in accordance with the substance employed. In addition, thin film transistor are divided into stagger type, co-planar type, self-aligned type, top gate type and the like, according to shape.

Hereinafter, description for the picture cell structure of liquid crystal display employing a conventional top gate type polysilicon TFT as a switching element is to be given with reference to the annexed figures.

Referring to FIGS. 1A through 1G, there are shown conventional fabricate processes for a gate top polysilicon TFT liquid crystal display.

Firstly, a transparent glass substrate 1 is entirely covered with a buffer layer 2 which is an insulating film superior in adhesiveness and on which a semiconductor layer 3 is subsequently formed, as shown in FIG. 1A.

Subsequently, using a photo etch process, the semiconductor layer 3 is removed selectively so as to form an active layer 3a which is left on only the TFT-forming region, as shown in FIG. 1B.

FIG. 1C illustrates that a gate insulating film 4 and a metal layer 5 are deposited over the entirety, in due order.

Next, an etch process is applied to the metal layer 5 and the gate insulating film 4 to selectively remove portions of them, forming a gate electrode 5a on the active layer 3a, and forming a gate line 5b as shown in FIG. 1D. The gate line 5b is to operate the TFT of another picture cell.

As shown in FIG. 1E, using the gate electrode 5a as a mask, n type ions are, as indicated by arrows, implanted at a high density dose in the active layer 3a. An annealing treatment results in the formation of source/drain regions 6a and 6b.

FIG. 1F shows the formation of an interlayer insulating film 7 having contact holes 8. For this, the interlayer insulating film 7 is deposited over the entire resulting structure of FIG. 1E and then, subjected to a selective etch process to form the contact holes 8 on the source region 6a and the drain region 6b.

Finally, as shown in FIG. 1G, a transparent electrode 9 is formed on a picture cell region of the TFT, followed by the formation of source/drain electrodes 10 on the source/drain regions. The source/drain electrodes are formed by depositing a metal such as aluminum and by applying a photo etch process to the metal so selectively as to leave it in only the contact hole regions. While the drain electrode interconnects the drain region 6b with the transparent electrode 9, the source electrode interconnects the source region 6a with a data line (not shown).

Such conventional liquid crystal display is operated as follows: application of a voltage greater than a threshold voltage to the gate electrode 5a lets a channel form at the interface between the gate insulating film 4 and the active layer 3a; during the formation of the channel, if a signal voltage is applied to the data line, the source region 6a is electrically conducted into the drain region 6b to transmit the signal voltage to the transparent electrode 9.

The liquid crystal display fabricated by the above conventional method shows such several problems as follow: first, since the source/drain electrodes 10 are connected with the source/drain regions 6a and 6b through the contact holes 8, respectively, it is difficult to control the contact resistance between the source/drain regions and the source/drain electrode; second, while the steps of depositing aluminum, coating a photosensitive film, exposing and developing are undertaken, the electrolyte of a developing solution may flow along the hillock of the aluminum deposited to come to contact with the transparent electrode 9 so that when the etching process is applied to the aluminum in order to form the source/drain electrodes 10, the transparent electrode 9 may be etched simultaneously with galvanic effect, resulting in breakage and an incomplete pattern of the transparent electrode 9; third, since the source/drain electrodes 10 are formed along with the data line which is made of single aluminum layer, the data line may be broken, so that the device reliability may be lowered.

SUMMARY OF THE INVENTION

Therefore, an object is to solve the aforementioned problems encountered in the prior art and to provide a method for: fabricating a liquid crystal display, capable of preventing a galvanic effect, controlling and reducing the contact resistance of the source/drain easily, preventing the breakage of data line and allowing an off-set structure, therein.

In accordance with the present invention, the above object can be accomplished by providing a method for fabricating a liquid crystal display, comprising the steps of: forming an active layer on a thin film transistor-forming region of a buffer layer atop a transparent substrate; forming a gate insulating film, gate electrode and a gate line on the active region; implanting impurity ions in the active layer by use of the gate electrode as a mask so as to form a source region and a drain region; depositing an insulating film entirely; forming contact holes in the insulating film, exposing the source region and the drain region therethrough; forming a transparent electrode on a picture cell of the insulating film; depositing a semiconductor layer doped with high density impurity and a metal layer, in due order; and applying an etch to the semiconductor layer and the metal layer selectively as to form a source electrode and a data line which are connected with the source region and to form a drain electrode which interconnects the drain region with the transparent electrode.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawing:

FIGS. 2A through 2I are schematic, cross-sectional views illustrating a method for fabricating a top gate type polysilicon TFT liquid crystal display in accordance with the present invention.

DETAILED DESCRIPTION OF THE INVENTION

Figure 1A:
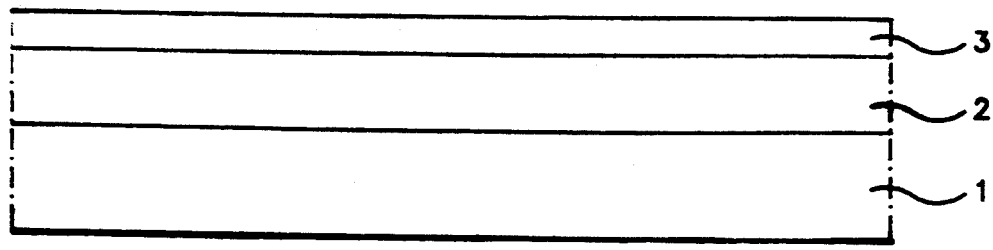
FIGS. 1A through 1G are schematic, cross-sectional views illustrating a conventional method for fabricating a top gate type polysilicon TFT liquid crystal display, respectively.
Figure 1B:
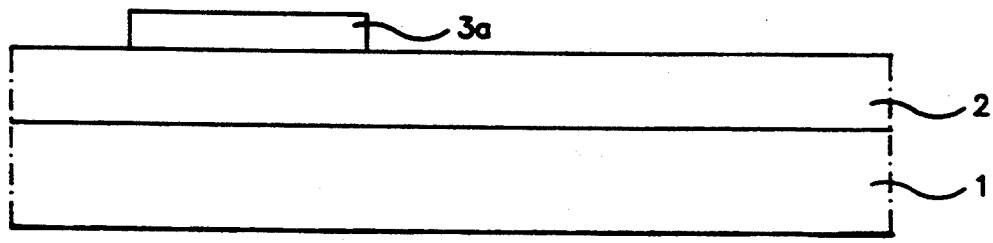
Figure 1C:
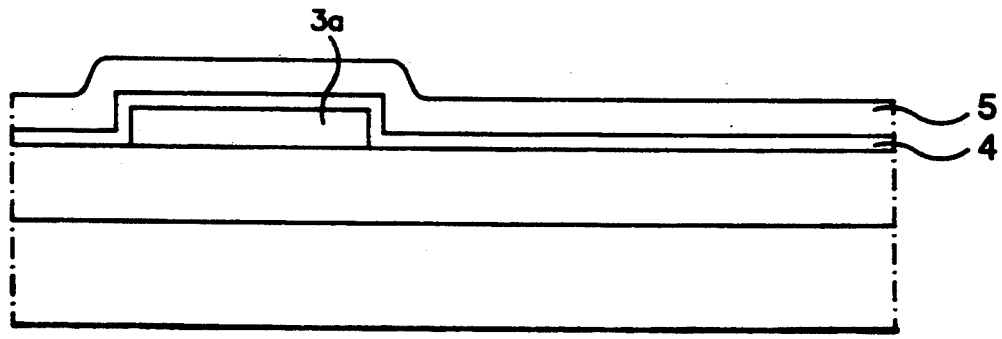
Figure 1D:
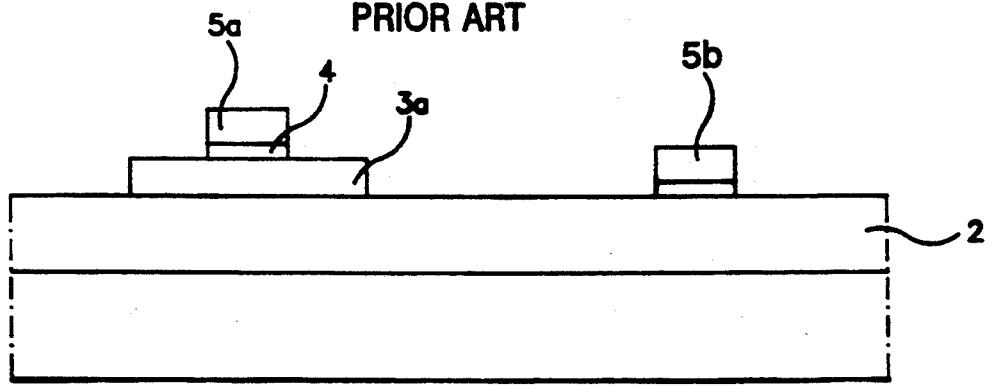
Figure 1E:
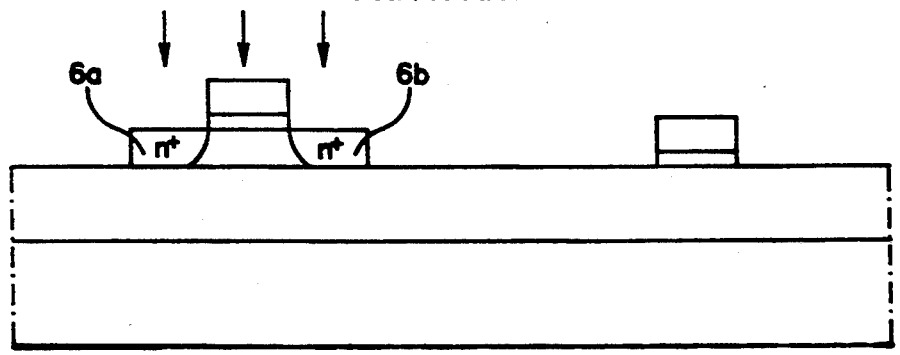
Figure 1F:
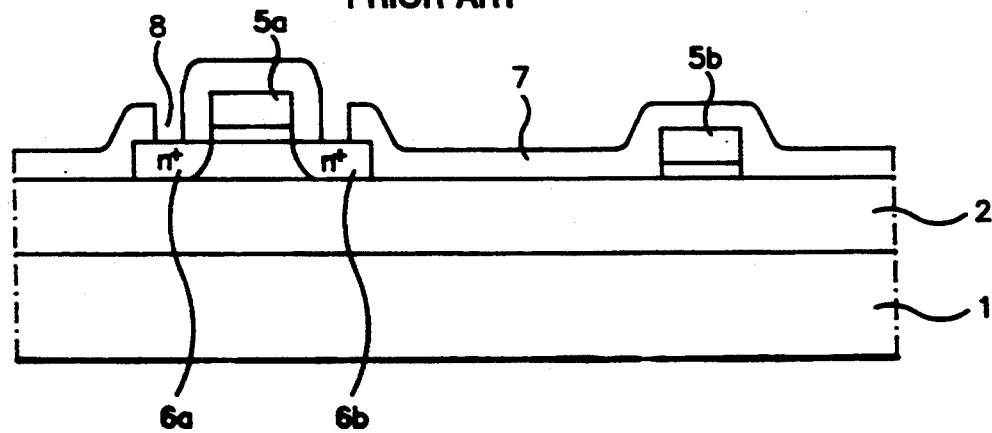
Figure 1G:
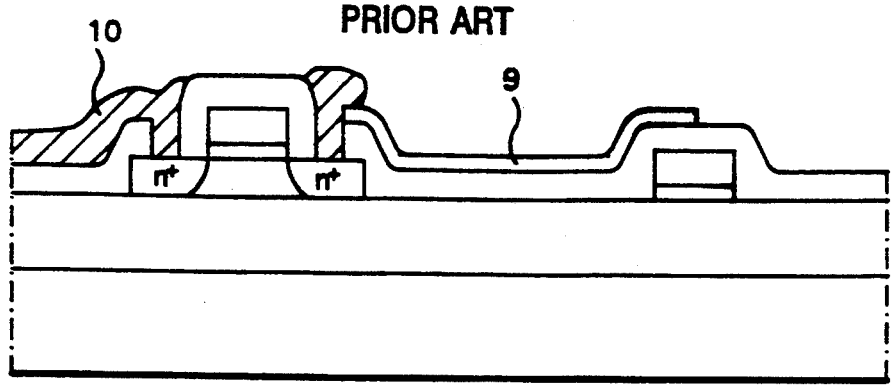

Hereinafter, the preferred embodiment of the present invention will be in detail described with reference to the drawings, wherein like reference numerals designate like parts, respectively.

Referring to FIG. 2A through 2I, there are shown fabricate processes for a gate top polysilicon TFT liquid crystal display according to the present invention.

Figure 2A:
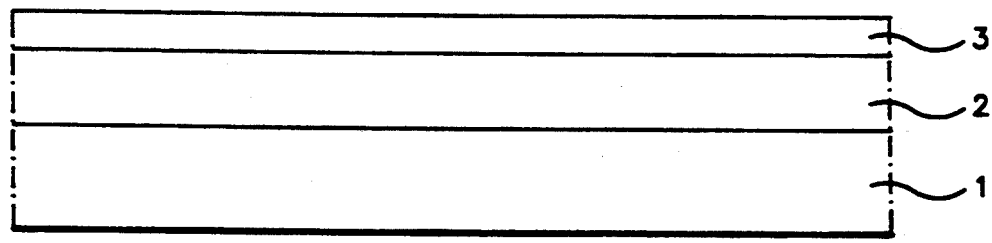

Firstly, a transparent glass substrate 1 is entirely covered with a buffer layer 2 which is an insulating film superior in adhesiveness and on which a semiconductor layer 3 is subsequently formed, as shown in FIG. 2A.

Figure 2B:
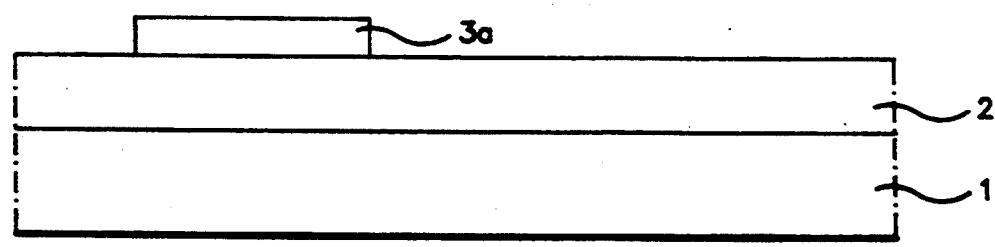

Subsequently, using a photo etch process, the semiconductor layer 3 is removed selectively as to form an active layer 3a which is left on only an active region of the TFT, as shown in FIG. 2B.

Figure 2C:
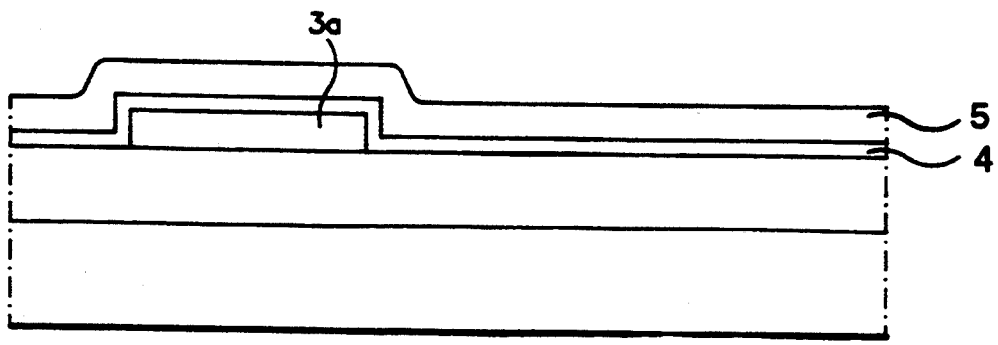

FIG. 2C illustrates that a gate insulating film 4 and a metal layer 5 are deposited over the entirety, in due order.

Figure 2D:
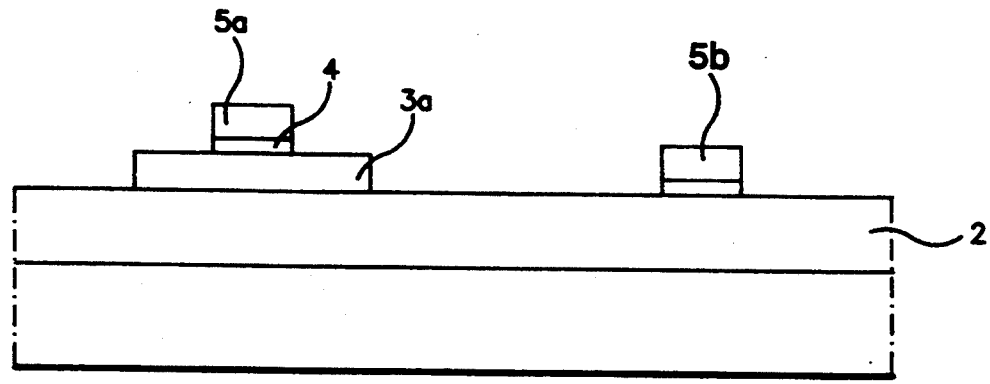

Next, an etch process is applied to the metal layer 5 and the gate insulating film 4 to selectively remove them, forming a gate electrode 5a on the active layer 3a, and forming a gate line 5b as shown in FIG. 2D. The gate line 5b is to operate the TFT of another picture cell.

Figure 2E:
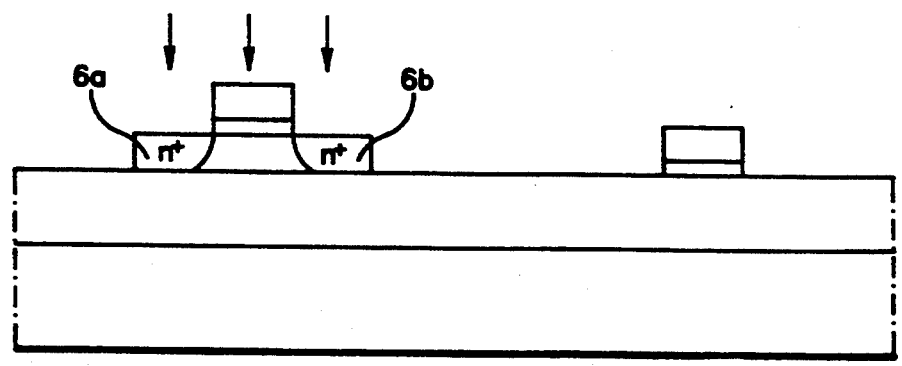

As shown in FIG. 2E, using the gate electrode 5a as a mask, n type ions are, as indicated by arrows, implanted at a high density dose in the active layer 3a. An annealing treatment results in the formation of source/drain regions 6a and 6b.

Figure 2F:
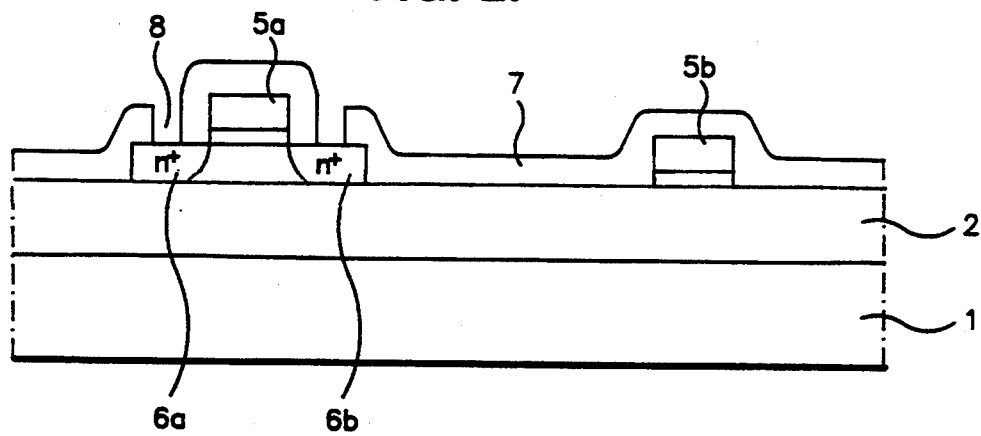

FIG. 2F shows the formation of an interlayer insulating film 7 having two contact holes 8. For this, the interlayer insulating film 7 is deposited over the entire resulting structure of FIG. 2E and then, subjected to a selective etch process to form the two contact holes 8 exposing the source region 6a and the drain region 6b therethrough, respectively.

Figure 2G:
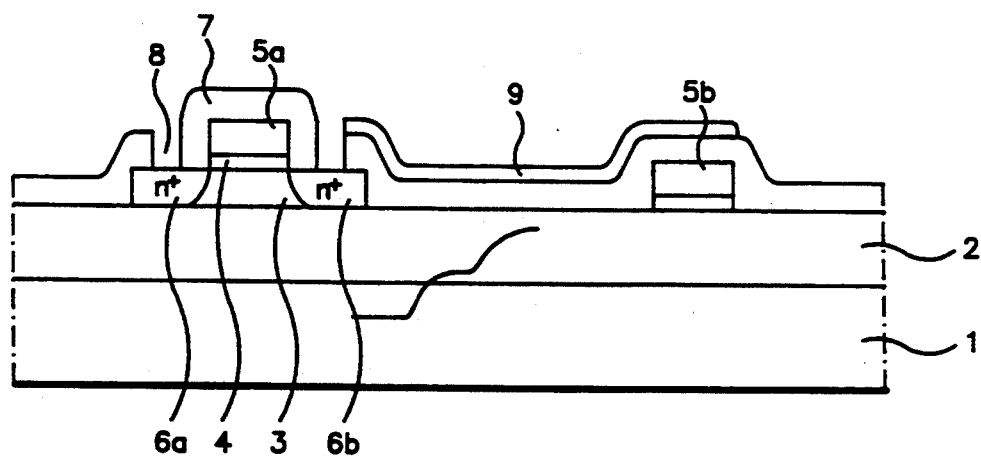

Following this, a transparent electrode 9 is formed on a picture cell region of the TFT, as shown in FIG. 2G.

Figure 2H:
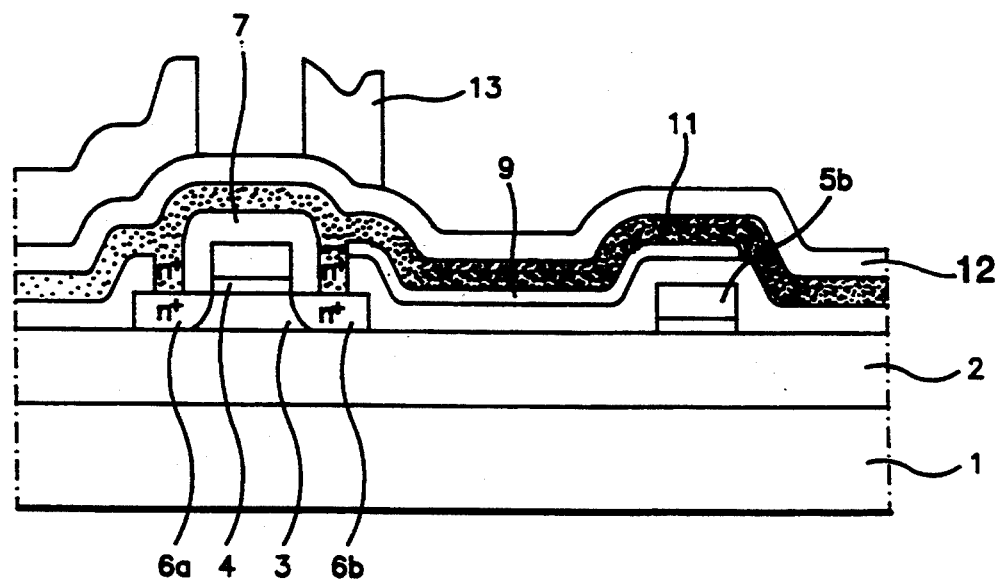
Figure 21:
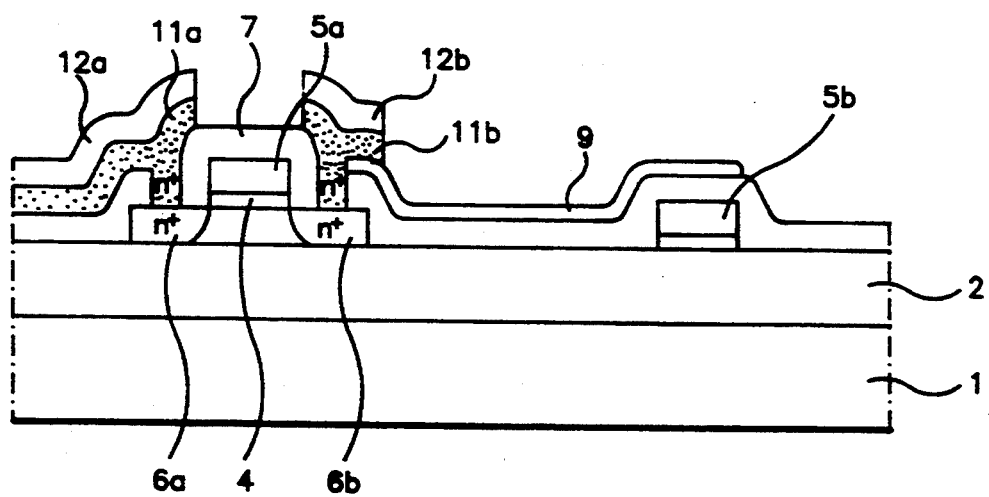

Subsequently, a polysilicon 11 doped with high density n type impurities is deposited over the entire resulting structure of FIG. 2G to connect the transparent electrode 9 with the source/drain regions through the contact holes, followed by the deposition of a metal 12 such as aluminum over the entire polysilicon 11, and then, after coating a photosensitive film 13 on the metal 12, it is exposed and developed by use of a source/drain electrode pattern mask to define a source/drain electrode region, as shown in FIG. 2H.

Finally, using the patterned photosensitive film 13 as a mask, the metal layer 12 and the polysilicon layer 11 are selectively subjected to etch to form a data line (not shown) and a source electrode stacked with a metal 12a and a polysilicon 11a which both are connected with the source region 6a through the one contact hole and to form a drain region stacked with a metal 12b and a polysilicon 11b which is connected with the transparent electrode 9. Then, the photosensitive film is removed, as shown in FIG. 2I.

This inventive liquid crystal display is operated in a manner similar to the conventional one.

As described above, the polysilicon doped with high density n type impurities and the metal such as aluminum are deposited successively in advance of the exposure and development with the photosensitive film, in accordance with the method of the present invention. Accordingly, even though the electrolyte of the developer flows along the hillock of the aluminum deposited when developing the photosensitive film, the galvanic effect is prevented because the electrolyte of the developer cannot come into contact with the transparent electrode 9 as the polysilicon fills the role of blocking layer.

In addition, the polysilicon doped with high density n type impurities comes into direct contact with the source/drain regions 6a and 6b, so that the top gate type liquid crystal display according to the present invention shows advantages such as the reduction of contact resistance and the facile control of the contact resistance.

Furthermore, since, instead of a single metal layer, the data line is formed by adopting the dual structure of the source and the drain electrodes made of the polysilicon doped with high density n type impurities and the metal layer, the data line is preventive of breakage and a set-off structure is possible, at same time.

What is claimed is:

1. A method for fabricating a liquid crystal display, comprising the steps of:
    forming an active layer on a thin film transistor-forming region of a buffer layer, said buffer layer being atop a transparent substrate;
    forming a gate insulating film and a gate electrode on said active region and forming a gate line;
    implanting impurity ions in said active layer by use of said gate electrode as a mask so as to form a source region and a drain region;
    depositing an insulating film;
    forming contact holes in said insulating film, exposing said source region and said drain region therethrough;
    forming a transparent electrode on a picture cell of said insulating film;
    depositing a layer of polysilicon doped with high density impurity which is connected with said drain region and said transparent electrode and a metal layer, in due order; and
    applying an etch to said polysilicon layer and said metal layer selectively to form a source electrode and a data line which are connected with said source region and to form a drain electrode which is connected to said drain region.

* * * * *